United States Patent Office 3,307,951

Patented Mar. 7, 1967

3,307,951

LITHOGRAPHIC PLATE

Dolor N. Adams, Cleveland Heights, and Daniel C. Thomas, Warrensville Heights, Ohio, assignors, by mesne assignments, to Lithoplate, Inc., Covina, Calif., a corporation of California No Drawing. Filed Feb. 1, 1963, Ser. No. 255,673
5 Claims. (Cl. 96—86)

This invention relates to a lithographic plate base adapted to receive a light-sensitive coating and thereafter to be further processed to provide a lithographic plate ready for printing.

It is known to prepare lithographic plates by treating a support member comprising a metal-surfaced sheet to form on the metal surface a relatively insoluble but hydrophilic layer. This plate base that is thusly produced is thereafter coated with a light-sensitive material to produce the lithographic plate that is capable, upon exposure to a pattern of light and subsequent development, of defining printing and non-printing areas. In some cases, the light-sensitive material may have relatively short storage life, in which case the plates are used within a short time. In other cases, the light-sensitive material may have inherently long storage life and the sensitized plates may be stored for extended periods provided any harmful reaction between the light-sensitive material and the plate base is prevented or inhibited. In other cases, the treated base is sold and stored for some time prior to being sensitized, as in the case of so-called "wipe-on" plates. In all such cases, the treated base should be such as to receive and retain the light-sensitive layer prior to exposure and development and to retain some areas of the sensitive layer after exposure while permitting removal of other areas. Also, the plate base should firmly retain the areas of coating which remain after development and should be hydrophilic in the areas where the coating has been removed.

One of the features of this invention is to provide an improved lithographic plate base adapted to receive a light sensitive coating to provide a lithographic plate, the plate base comprising a support member having thereon a coating formed by applying a composition comprising a cycloaliphatic polyphosphoric acid of the nature of phytic acid to this support member and in which the support member is substantive to the acid composition.

Other features of the invention will be apparent from the following description thereof.

The lithographic plate base of this invention utilizes a support member or support sheet having a substantially uniform surface portion on at least one side thereof to which phytic acid is substantive, that is, to which phytic acid will bind to form an adherent layer which is not removed by rinsing with water. Desirably, the surface of the support member is basic in character, that is, contains reactive centers which are basic. The support member may be a metal or metal-surfaced sheet, or a non-metallic sheet, such as paper or plastic, whose surface either inherently or through treatment is such that a composition containing phytic acid is substantive to it. A non-metallic sheet to which one of the amino-plast resins hereinafter described has been applied may form such a support member.

Before applying the polyphosphoric acid composition to a metal sheet or foil the latter should be thoroughly cleaned as by washing with a cleaning solution that is then rinsed off or otherwise removed.

The lithographic plate base has adhered to this support member a novel adherent barrier coating which retains its hydrophilic character for extended periods of time prior to application of a light-sensitive coating and also, in cases where the support member has a metal surface, seals the surface of the support member so that reactive contact between the metal and an overlying light-sensitive coating or sensitizer is prevented or inhibited.

The barrier layer is hydrophilic and oleophobic so as to be scum preventing and to reduce tone in the resulting printing plate. It is substantially free of water soluble material. A combination of this barrier layer and the subsequently applied sensitizer has good shelf life, clean running properties and good length of run.

The phytic acid used in preparing the lithographic plate base is a polyphosphoric acid ester of inositol. As all six hydroxyl groups of inositol are esterified, each with a molecule of orthophosphoric acid, phytic acid contains 12 labile hydrogen groups so that it is a relatively strong acid that will react with basic reaction centers. It has the empirical formula $C_6H_{18}O_{24}P_6$.

The phytic acid is soluble in both water and alcohol such as aliphatic alcohols. It is preferably used in solution, with aqueous solutions being especially preferred. As it is infinitely soluble in water, any concentration desired may be employed. Phytic acid is customarily supplied by the producer in 70% aqueous solution. Although this can be used for direct application to the clean support member, it is preferred that the solution contain from about 0.1% to 10% of phytic acid. An excellent concentration is 1% in water with the support member immersed in the solution for about 2 minutes.

Although it is possible to produce a plate base by applying the phytic acid solution to the cleaned support member followed by direct application of a sensitizer, if desired, the sheet may have applied thereto an intermediate aminoplast resin layer prior to the treatment with the phytic acid. The resins that may be used to supply this intermediate layer may be either an amino modified urea-formaldehyde resin as disclosed in U.S. Patent 2,554,475, a sulfonated urea-aldehyde resin as disclosed in U.S. Patent 2,559,578, an alkylated (either methylated or ethylated) methylol melamine resin as disclosed in U.S. Patent 2,715,619, or a polyalkylene-polyamine-melamine-formaldehyde resin as disclosed in U.S. Patent 2,796,362. In all these resins the reaction centers for the phytic acid treatment are provided by the $NH_2$ groups. As a further step it is preferred that before application of the sensitizer the phytic acid coated support member be treated with a solution of a metal salt to further insolubilize the phytic acid.

The insolubilizing agents for the phytic acid layer are water soluble salts of metals, preferably aluminum, zirconium, hafnium, titanium and thorium, with zirconium being especially preferred The salt that is used must be one whose reaction product with phytic acid is water insoluble and does not react substantially with the sensitizer such as a diazo. The metal salt acid radical is any that will make the metal compound water-soluble and that will not react with the other materials of the base. Typical salt groups are the acetates, nitrates and sulfates, and these are relatively inexpensive and easy to obtain. Other salts, of course, may be used, subject to the foregoing qualifications. The metal compound solution preferably has a concentration of 0.01–10.0% by weight and is preferably applied at a temperature of from room temperature to about 185° F. The upper limit of 185° F. herein is merely a practical upper limit, as any temperature may be used below the boiling point of water. The treatment with the metal salt solution may be as rapid as practical, and in commercial instances is between 5 seconds and 10 minutes. After application of the metal salt solution, the plate base is rinsed with water, preferably running water such as tap water.

The light sensitive material that is applied to the base of this invention to produce the lithographic plate may be any of the usual types of materials including diazo compounds, bichromated casein and bichromated albumin. All these materials, of course, are capable of reacting with light and particularly ultraviolet light such as through a stencil or photographic transparency to define printing and non-printing areas of the finished plate, the printing areas being organophilic and hydrophobic and tightly bonded to the underlying base.

In the case of negative-working diazo compounds, and bichromated casein and albumin, the exposed light sensitive material thus provides a printing image while the unexposed material being water-soluble can be washed away from the unexposed areas leaving the above-described underlying hydrophilic surface free of the sensitizer. As is well known in this art, an albumin sensitizer may be prepared by applying to the base a water solution of albumin that has previously been made sensitive to the action of light by the addition of a sensitizing agent such as ammonium chromate or bichromate. After the solution has been applied the plate is permitted to dry and is then ready to be exposed to light. Other such sensitized dispersions or solutions include halogenated polyvinyl alcohol in aqueous dispersion or solution as described in Patents 2,179,245, 2,199,865 and 2,342,175 or dispersions or solutions of proteins such as casein described in Patents 2,324,197, 2,324,198 and 2,500,453.

Typical diazo sensitizers are ideally suited for use with the prepared base of this invention and typical sensitizers of this type are dsecribed in Patents 2,100,063, 2,667,415, 2,679,498 and 2,958,599. A preferred diazo compound of negative-working type is prepared by condensing paraformaldehyde with p-diazo-diphenylamine sulfate as set forth in Patent 2,100,063. An effective diazo sensitizer of the positive working type is Formula 1 of Patent 2,958,599. The dispersion or solution of the sensitizer or light sensitive material may be applied to the prepared base by dipping, spraying, roller coating, brushing or the like which are all conventional in this art.

When stable photosensitive sensitizers such as the above-cited diazo compounds are used, the plate may be described as presensitized, i.e., capable of being stored for extended periods after sensitization and before exposure and development. In addition, a plate base such as described may be stored and shipped in trade in an unsensitized condition for sensitization by the ultimate user as by the well-known "wipe-on" method.

When a metal sheet such as an aluminum sheet is used as the support member the sheet is preferably given a controlled oxidizing treatment, although the surface may, if desired, be merely cleaned in a known manner and allowed to oxidize as a result of the cleaning conditions. Controlled oxidizing of aluminum, for example, may be accomplished in a customary and well known manner either by using an oxidizing agent or electrolytically. A preferred way of oxidizing aluminum is by applying thereto a 2% solution of chromic acid in water in 150° F. The oxide, of course, includes water and this provides the basic character desired in the surface.

Whever the term water dispersible is used herein, it is intended to include both water soluble and molecular and multimolecular dispersions including those that are dilutable with water.

EXAMPLE 1

In this example an aluminum sheet was cleaned by treating for 3 minutes at 70° C. with a 20% solution of trisodiumphosphate in water. It was then spray rinsed with tap water for 2 minutes and desmutted by treating with a 70% solution of nitric acid for 2 minutes followed by spray rinsing with tap water for 2 minutes. The sheet was then flushed with de-ionized water for 1 minute and then dipped in a 1% solution of phytic acid for 2 minutes. It was then spray rinsed with de-ionized water for 2 minutes. Immediately thereafter it was sensitized by coating with the specific diazo compound from Patent 2,100,063 described above. The resulting sensitized plates was capable of long storage life without substantial deterioration.

EXAMPLE 2

The above Example 1 was repeated except that after the phytic acid dip and water rinse the sheet was dried under infrared heat, dipped in a 0.13% aqueous solution of zirconium acetate and again rinsed before being sensitized.

EXAMPLE 3

The above Example 1 was repeated except that after the final rinse the plate base was dried. After storage for three months the plate was sensitized by wiping over its surface a solution of the diazo compound mentioned. On exposure and development a long-running, clean plate was obtained.

EXAMPLE 4

In this example an aluminum plate was cleaned in trisodiumphosphate as noted above in Examples 1 and 2 and was then soaked in hot water for 2 minutes at 120° F. It was then pickled by immersing for 2 minutes in aqueous sulfuric acid of 0.8% concentration containing 3% chromic acid. It was then immersed in a 2% solution of chromic acid at 154° F. for 2 minutes followed by flushing for 2 minutes with water. The plate was then immersed in a 0.55% aqueous solution of a polyalkylenepolyamine-melamineformaldehyde resin such as disclosed in U.S. Patent No. 2,796,362 at a pH of 6.5. The plate was then flushed with water for 2 minutes followed by immersion in a 1% solution of phytic acid for 2 minutes. The plate was then flushed with water and dipped in a .1% solution of zirconium acetate containing acetic acid to give a pH of about 3.4 with this immersion being for 2 minutes. The plate was then flushed with water and then roller coated with the above diazo resin of Example 1 in a 2.2% aqueous solution. Again, an efficient storable presensitized plate was produced.

EXAMPLE 5

A plate was prepared as in Example 4 except that the step of dipping in zirconium acetate containing acetic acid was omitted and the plate was dried prior to flushing with water and coating with the diazo resin.

EXAMPLE 6

The above Example 4 was repeated except that after the final rinse the plate base was dried. After storage for three months the plate was sensitized by wiping over its surface a solution of the diazo compound mentioned. On exposure and development a long-running, clean plate was obtained.

EXAMPLE 7

In preparing a positive working plate a brushed aluminum sheet was cleaned as in Example 1 above, dried under infrared light and coated as in Example 1 of U.S. Patent 2,958,599 in which a 1.5% solution of a compound corresponding to Formula 1 of this patent in ethylene glycol monomethyl ether was used. The solution was applied to the sheet by means of a plate whirler and the coating dried. A positive image ready for printing was produced by exposing the plate through a transparency, developing with 3% aqueous trisodiumphosphate solution and finally rinsing with water to remove the water soluble materials.

In further examples, each of Examples 1 through 6 was repeated except that in each the base was sensitized with a bichromated colloid, specifically albumin, to produce surface-type negative working lithographic plates, and Example 7 was repeated except that the base was coated with bichromated gum arabic to produce a positive working deep etch lithographic plate.

Other examples also using phytic acid solution, but containing different amounts of phytic acid, different resins and insolubilizing agents of the types described above and different conditions also produced excellent lithographic plates. Instead of using phytic acid itself, it is possible to use a salt such as water insoluble calcium phytate and solubilize it by acidifying with a suitable acid, such as aqueous $H_3PO_4$. The phytic acid or its partial salt is obtained in solution and is suitable for practicing this invention.

Having described our invention as related to the embodiments set out herein, it is our intention that the invention be not limited by any of the details of description, unless otherwise specified, but rather be construed broadly within its spirit and scope as set out in the accompanying claims.

We claim:

1. In a lithographic plate having a support member, an overlying layer of a light sensitive coating and an intermediate coat between said support member and light sensitive coating, the improvement characterized by providing as said coat a substantially water insoluble coating produced by applying to said support member a composition comprising a cycloaliphatic polyphosphoric acid of the nature of phytic acid, said support member being substantive to said acid.

2. In a lithographic plate having a support member with a metal surface, an overlying layer of a light sensitive coating and an intermediate coat betwen said support member and light sensitive coating, the improvement characterized by providing as said coat a substantially water insoluble coating produced by applying to said metal surface a composition comprising a cycloaliphatic polyphosphoric acid of the nature of phytic acid.

3. In a lithographic plate having a support member, an overlying layer of a light sensitive coating and an intermediate coat beiween said support member and light sensitive coating, the improvement characterized by providing as said coat a substantially water insoluble coating produced by applying to said support member a composition comprising a cycloaliphatic polyphosphoric acid of the nature of phytic acid followed by treating with a solution of a metal salt insolubilizing agent for said phytic acid, said support member being substantive to said acid.

4. The plate of claim 3 wherein a resin of the class consisting of amino modified urea-formaldehyde resins, sulfonated urea-aldehyde resins, alkylated methylol melamine resins and polyalkylenepolyamine-melamine-formaldehyde resins is applied to said support member before said acid composition, and said acid composition is applied over said resin.

5. In a lithographic plate having a support member, an overlying layer of light sensitive coating and an intermediate coat between said support member and light sensitive coating, the improvement characterized by providing as said coat a substantially water insoluble coating produced by applying to said support member a composition comprising a cycloaliphatic polyphosphoric acid of the nature of phytic acid followed by treating with a solution of a metal salt insolubilizing agent for said phytic acid of the class consisting of zirconium, hafnium, titanium and thorium water soluble salts, said support member being substantive to said acid.

References Cited by the Examiner

UNITED STATES PATENTS

| | | | |
|---|---|---|---|
| 2,846,336 | 8/1958 | Pardo | 117—127 |
| 2,946,683 | 7/1960 | Mellan et al. | 96—75 |
| 3,007,818 | 11/1961 | Schimkus | 260—461.303 |
| 3,030,210 | 4/1962 | Chebiniak | 96—75 |
| 3,070,460 | 12/1962 | Huppke | 117—127 |
| 3,073,723 | 1/1963 | Deal et al. | 96—33 X |

FOREIGN PATENTS

| | | |
|---|---|---|
| 815,471 | 6/1959 | Great Britain. |

J. TRAVIS BROWN, *Acting Primary Examiner.*

R. L. STONE, R. H. SMITH, *Assistant Examiners.*